United States Patent [19]

Thiel

[11] 4,290,013
[45] Sep. 15, 1981

[54] METHOD OF AND APPARATUS FOR ELECTRICAL SHORT TESTING AND THE LIKE

[75] Inventor: David W. Thiel, Acton, Mass.
[73] Assignee: GenRad, Inc., Concord, Mass.
[21] Appl. No.: 50,993
[22] Filed: Jun. 22, 1979
[51] Int. Cl.³ .............................................. G01R 15/12
[52] U.S. Cl. ............................. 324/73 PC; 324/73 R; 324/158 T
[58] Field of Search ........... 324/73 AT, 73 PC, 73 R, 324/158 T, DIG. 1, 51, 62; 364/552

[56] References Cited

U.S. PATENT DOCUMENTS

| | | | |
|---|---|---|---|
| 3,441,849 | 4/1969 | Bennett et al. | 324/73 R |
| 3,492,571 | 1/1970 | Desler | 324/73 R |
| 3,528,104 | 9/1970 | Ehlschlager | 324/51 |
| 3,784,910 | 1/1974 | Sylvan | 324/73 AT |
| 4,114,093 | 9/1978 | Long | 324/73 AT |

Primary Examiner—David K. Moore
Attorney, Agent, or Firm—Rines and Rines, Shapiro and Shapiro

[57] ABSTRACT

This disclosure is concerned with a process for connecting a short detector to electrical nodes in such apparatus as backplanes, cables and circuit boards before components are assembled thereto, to identify shorted node pairs in a substantially smaller number of tests than required by previously known methods, through a novel binary screening and then binary searching technique; the invention being especially efficient in the case where no shorts are present.

20 Claims, 8 Drawing Figures

METHOD OF AND APPARATUS FOR ELECTRICAL SHORT TESTING AND THE LIKE

The present invention relates to methods of and apparatus for detecting electrical shorts and the like in electrical and electronic circut boards, back-planes, cables and similar systems, being more particulary directed to the significant reduction in number of testing connections to electrical nodes required to find the fault; and, from methodology considerations, being applicable to other types of systems, including in other fields of application, as well, having similar or analogous operational considerations.

In present-day technology for the manufacturing of electrical or electronic circuits and the like, the difficulty of producing such circuits without faults is mounting as the circuits are radically miniaturized and subminiaturized, and the complexity and multifunctions of the components thereof are strikingly increased. Manufacturers must test such circuit assemblies not only to insure that components have been placed in the circuit properly and have not been damaged in assembly, but also to determine that the circuit as a whole functions properly. The art has struggled over the years to provide more efficient and higher speed testing for such circuits. The object of such testing, should a fault be discovered, is to pinpoint the location of the fault so that the newly-manufactured circuit can be quickly repaired and made functional. Sophisticated computer-aided techniques for this purpose have been developed such as the CAPS system of GenRad, Inc., the assignee of the present application, as described, for example, in "Automatic Fault Location Using On-Line Simulation", Rene, Haas, Lutz, Henckels and David Schneider, Technical Paper Presented at the Institute of Electrical and Electronics Engineers International Convention and Exposition "Intercon 74", Mar. 26–29, 1974. Another technique for improving the test and diagnosis process involves manual probing and is described in "The Smart Probe-A New Diagnostic Tool", Test Systems Division Application Note 1, General Radio Co. (now GenRad, Inc.) August, 1975.

A prevalent type of fault in today's technology is the unwanted short between two nodes of a circuit. Such shorts can be detected and located with much simpler techniques than the sophisticated methods mentioned above. Such sophisticated testing is, of course, obscured and slowed by the presence of shorts between nodes. Testing efficiency can be improved, therefore, if such shorts can be detected and removed before the sophisticated testing process is begun.

Testing for shorts is needed also in the manufacture of other electrical devices such as cables, backplanes, bare circuit boards, etc., and other types of apparatus, as well.

Underlying the present invention is the discovery of a novel binary screening and binary searching philosphy or technique that has enabled vast reductions in number of required tests and time for short identification. It is in order, however, before further describing the prior art and contrasting the same from the invention, to provide definitions of terms as used herein. Referring to the application of the invention to the electrical field, the generic term "node", as used herein, is intended to define an isolated electrical conductor or connection point, with the same concept applying to analagous points of similar systems in other than the electrical field. The word "short" connotes the (generally unwanted) presence of a short-circuit or, more generically, of an electrical resistance between two nodes of less than some preselected value. A "short detector" is apparatus having at least two connection leads which, when connected respectively to two nodes or groups of nodes, can detect the presence of a short between those nodes or groups of nodes.

In the prior art of shorts testing, various straight-forward techniques have been employed. The most thorough of these is to test each node pair separately. The first node is tested against the second, then the third, etc., and then the second node is tested against the third, then the fourth, etc., until finally the (N−1)th node is tested against the Nth. This requires $(N-1)+(N-2)+(N-3)+ \ldots +3+2+1$ or $\frac{1}{2}(N^2-N)$ shorts tests. Because this number is of the order of magnitude of $N^2$, this method might be called the "N-Squared Test". When the number of nodes is large, this requires a very large number of shorts tests.

A modification of the above is the "Terminating N-Squared Test" which is identical to the "N-Squared Test" except that if a connection is found, further tests with the present first node of the pair are not executed. The connection to the first node is, rather, moved to the next; and testing continues.

For example, if node 4 is found to be shorted to node 5, further testing with node 4 is discontinued and testing continues with node 5. If node 4 is shorted to some other higher-numbered node, say 7, node 5 will be, also. It is impossible to determine whether 4 is shorted to 5 and also to 7, or whether 4 is shorted to 7 which is shorted to 5, etc. When, and only when, shorts are present, this technique requires fewer tests than the N-Squared Test, and again shorted nodal pairs or groups are completely identified.

In further searching for methods of reducing the number of tests required for testing assemblies with large numbers of nodes, some manufacturers have used what might be called the "Linear Test". In this technique, each node is tested individually against all others collectively. For N nodes, N tests are required. When shorted nodes are found, it is not determined to which other nodes they are shorted. This reduced amount of information is acceptable, in some cases, in return for the greatly reduced number of shorts tests required.

An object of the present invention, however, is to provide a new and vastly improved process or method of and apparatus for short detection that enables testing for and identification of all node pairs which are shorted, and does so with a significantly smaller number of tests than is required by any of the above-described previously known methods.

As such, the invention is particularly useful for testing any multiplicity of electrical nodes, such as multiconductor cables, backplanes, printed circuit boards before component parts are assembled thereto, and the like.

A further object of the invention, moreover, is to provide such a novel method and apparatus that are also adapted for highly efficient shorts testing in the presence of components connected to the nodes of an assemblied electronic circuit which, by shunting in combination, may give the false appearance of shorts when many pairs are being connected together and tested at the same time.

Still a further object is to provide a novel short or similar fault detector of more general utility, also.

Other and further objects will be explained hereinafter and are more particularly delineated in the appended claims.

The objectives of the invention are achieved by testing in two steps; a first step which might be called a binary screening, consisting of $\log_2 N$ tests (where N is the number of nodes) to detect the presence of shorts, and a second step which is a binary searching consisting of no more than $4(\log_2 N - 1)$ tests per shorted pair to identify the shorted node pairs.

Because shorts between some node pairs will be detected in more than one of the screening tests, the method underlying the invention involves alternating screening and searching tests, and, when a shorted node pair is identified, excluding one of those nodes from further screening or searching tests, thereby preventing redundant searching for the same node pair.

Using this method for eliminating redundant searching, full identification of shorted node pairs is accomplished with $$\log_2 N + 4M (\log_2 N - 1)$$

tests, where N is the number of nodes and M is the number of shorts found. As noted above, the prior art N-squared search requires $$(N^2 - N)/2$$

tests. When the number of nodes is large, indeed, the difference in the number of tests required by these processes is most remarkable.

The following chart compares the number of tests required by the prior art N-squared test, and the strikingly reduced number required by the process of this invention, for various values of N and M:

| (The N-squared test) | | (The present invention) | | | | |
|---|---|---|---|---|---|---|
| | $N(N-1)$ | $\log_2 N + 4M (\log_2 N - 1)$ | | | | |
| N | 2 | M = 0 | M = 1 | M = 2 | M = 3 | M = 4 |
| 64 | 2016 | 6 | 26 | 46 | 66 | 86 |
| 128 | 8128 | 7 | 31 | 55 | 79 | 103 |
| 256 | 32640 | 8 | 36 | 64 | 92 | 120 |
| 512 | 130816 | 9 | 41 | 73 | 105 | 137 |
| 1024 | 523776 | 10 | 46 | 82 | 118 | 154 |
| 2048 | 2096128 | 11 | 51 | 91 | 131 | 171 |

The real power of the method of this invention may be seen in the case where no shorts are present. 1024 nodes can be proved to have no shorted node pairs in only 10 tests.

As before stated, in an assembled electronic circuit, the combined shunting effect of the components may, during the screening tests, falsely give the appearance of the presence of a short. In accordance with the present invention, the binary searching as rapidly as possible reduces the number of nodes being tested simultaneously, thereby removing the appearance of a short, so that the binary searching can in such case be discontinued. The number of tests in this case will be somewhat larger than given by the above formula and shown in the above table. When a short is discovered, however, the final test is made from one node to one other node, only, giving the best possible resolution of the question whether a short is a true short or not.

In summary, therefore, from one of its important aspects, the invention embraces a method of short detection and the like across a pair of leads, that comprises, connecting one lead to up to and including half of the nodes of a system under test; connecting the second lead up to and including the remaining half of said nodes; successively varying the connecting of different groups of said nodes to the leads in accordance with a predetermined pattern to enable successive screening tests for shorts of different combinations of half such nodes against the other half of such nodes; and searching, in the event that a short is detected, by successively reducing the number of nodes connected to one lead until that lead is connected to only one node, and reducing the number of nodes connected to the other lead until that lead is connected to only one other node, thus permitting a determination of of the shorting of the node pair. Ancillary inventive features and operational and constructional details are hereinafter set forth.

The invention will now be described with reference to the accompanying drawings. Because this invention makes use of binary techniques it will be described in terms of testing $N = 2^n$ nodes, where N is an integer. For ease and clarity of explanation, the $2^n$ nodes will be numbered from 0 to $2^n - 1$.

Figure 1:
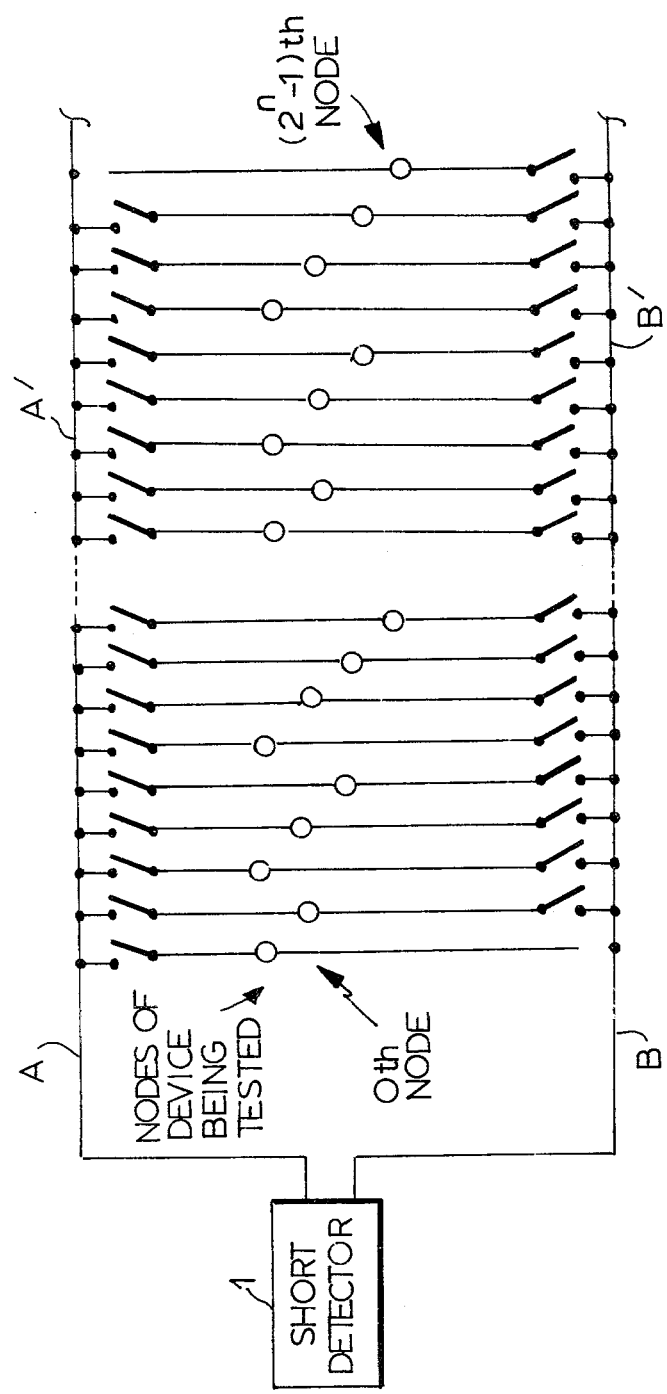
FIG. 1 is a schematic block and circuit diagram of apparatus adapted to be operated in accordance with the invention.

Referring to FIG. 1, the invention is illustrated as practiced with the aid of any suitable short detector 1 capable of distinguishing between the presence and absence of shorts, (ohmeter, for example,) having two leads, labelled A and B. The leads A and B are respectively connected to connection switches A' and B' for connecting lead A to at least half of the nodes of the circuit (so-labelled) at one time, and for also connecting lead B to at least half of the nodes of the circuit at one time, as more fully described in connection with FIG. 5. It should be noted that in this method, such apparatus, in minimum form, can have one node not accessed by one such switch connection means, such as switch B' not having a switch to connect with the 0th node; and a different node, shown as the $(2^n - 1)$th node, not accessed by the other connection switch means A'. This distinction will later be explained.

In an automated version of this type of system, control means is provided so that the switch connection means may be commanded by a sequencer or by a digital computer, to perform in accordance with the technique herein described. While the invention is not limited to the actual described mode of operation of the short detector, the following examples illustrate how the short detector 1 can be constructed and operated in accordance with the invention.

Figure 2:
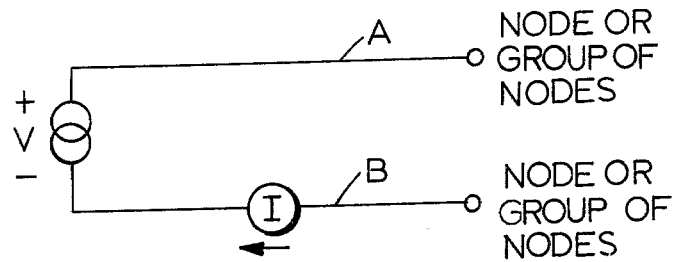
FIGS. 2, 3 and 4 are circuit diagrams of suitable short detectors for the apparatus of FIG. 1.
Figure 3:
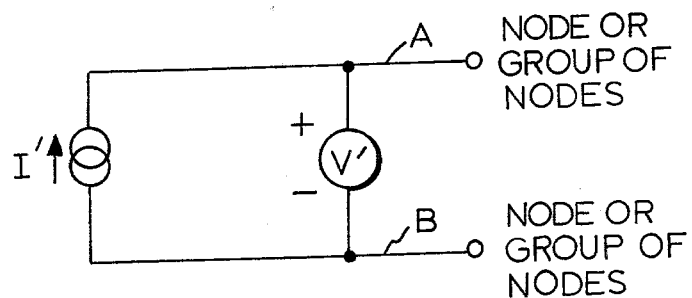

Two basic types of short detector 1, which measure a resistance-dependent parameter, e.g., current or voltage, and convert the measured value to a resistance value, are shown in FIGS. 2 and 3. In FIG. 2, a voltage source V is connected in series with a current-measuring device I and, via leads A and B, with the pair of nodes or sets or groups of nodes being tested. The measured resistance is equal to the voltage divided by the measured current. Alternatively, as shown in FIG. 3, a current source I' may be connected in parallel with a voltage-measuring device V' and in parallel with the pair of nodes or sets or groups of nodes being tested. The resistance is the measured voltage divided by the current. In either of the systems of FIGS. 2 and 3, the presence of absence of a short is determined by selecting some appropriate value of resistance as a criterion; and a measured value less than the selected value is considered a short, and a measured value higher than the same, is not.

Apparatus of the general form of FIG. 2 is preferred for the testing of circuits containing semiconductor components and the like because a value of voltage can be selected which is so low (say 1/10 volt) that semiconductor components cannot be inadvertently damaged. In an automated system for shorts testing, moreover, the calculation of the value of resistance and the comparison of that value against a preselected value may, of course, also be carried out by a digital computer.

Figure 4:
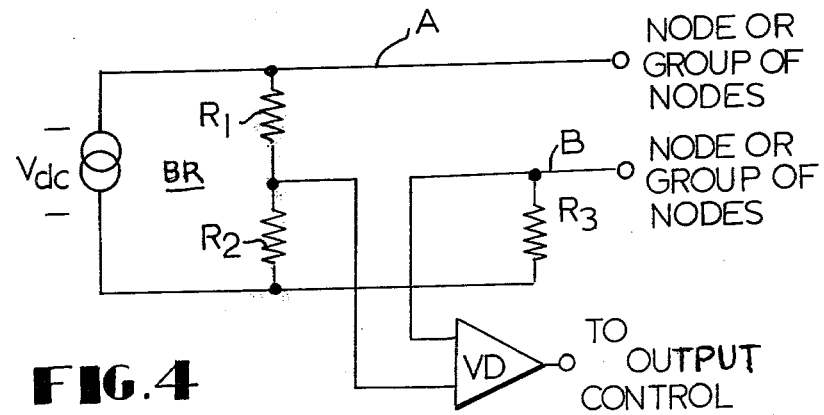

A simpler version of a short detector 1 can be constructed, however, which does not require a measurement of current or voltage, calculation of resistance, and comparison against a preselcted value. Such a simple short detector 1 is shown in FIG. 4. It consists of a dc source $V_{dc}$, a resistance bridge BR and a voltage discriminator VD. Three arms of the bridge are the resistors, $R_1$, $R_2$ and $R_3$, each made of value corresponding to the preselected short value. The node pair or groups or sets of nodes being tested is or are connected by leads A and B as the fourth arm of the bridge. The output of the voltage discriminator VD will be, for example, a logic signal "high", if the resistance between those nodes or groups of nodes is higher than the preselected value, and a logic signal "low" if that resistance is lower than the preselected value. In an automated system, that single signal could be returned to a sequencer or digital computer, schematically illustrated by the label "TO OUTPUT CONTROL", controlling the testing by well-known technique. That one bit of information is, moreover, the only result of each test needed by the process of the invention herein described.

The preferred method of using the above-described apparatus for the detection and identification of shorted nodes consists of two parts. The first part is a number of screening tests which determine whether any shorts exist, without identifying the specific node pairs which are shorted; and the second part is a number of searching tests for finding nodes which are shorted. If no shorts are found in the first part of the test, the second part need not be carried out. The method is therefore particularly efficient for the case of good circuits containing no shorts.

Figure 5:
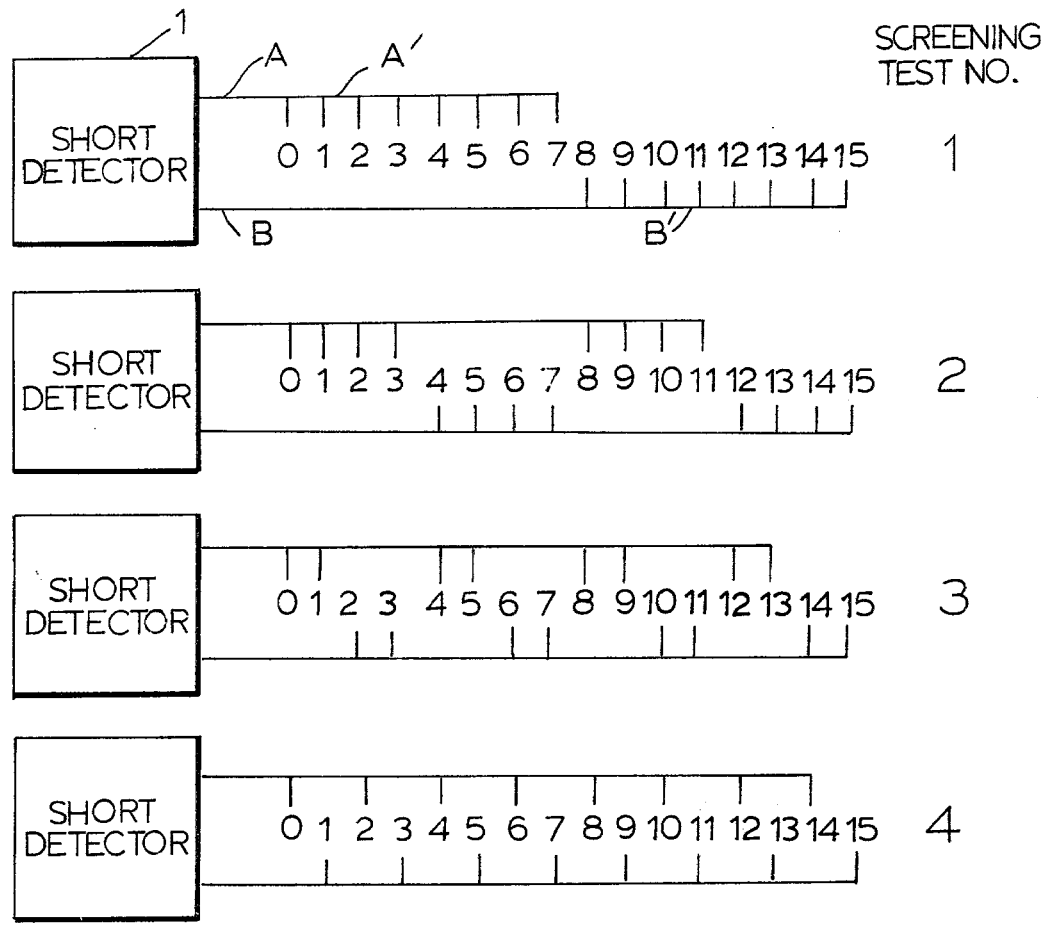
FIG. 5 is a circuit diagram illustrating a preferred pattern or best mode of screening tests in accordance with the method or process underlying the invention.

A successive switch connection diagram for this process is shown in FIG. 5 for a predetermined pattern of four screening tests. While N=16 nodes are therein illustrated (0 to 15), more generally N nodes may be involved, being numbered from 0 to $2^n - 1$ (N=$2^n$), where n is the number of screening tests. In FIG. 5, n=4. For the first screening test numbered "1" in FIG. 5, the half of the nodes having lower numbers (0-7) is shown connected by switches A' to short detector lead A; and the half of the nodes having the higher numbers (8-15) is connected via switches B' to short detector lead B. For the second screening test "2", the nodes are divided into fourths, and the first and third or odd fourths (0-3 and 8-11) are switched to short detector lead A, and the second and fourth or even fourths (4-7 and 12-15) are connected to short detector lead B. Further screening tests are carried on by continuing in this manner by dividing the nodes into eighths (test "3"), sixteenths (test "4"), etc. For the last screening test of the pattern, all even-numbered nodes (starting with number 0) will be connected to lead A, and all odd-numbered nodes will be connected to lead B. For $2^n$ nodes, there will have been n such screening tests, also indicated in the upper part of the flow diagram of FIG. 6.

For testing a device having less than $2^n$ nodes, but more than $2^{(n-1)}$ nodes, the testing is carried out as though there were $2^n$ nodes. Obviously, no shorts will be discerned involving non-connected, non-existent nodes.

If the N nodes are thought of as being numbered from 0 to $(2^n - 1)$ by binary numbers, it can be seen that in the first test, the nodes whose binary numbers have the most significant bit equal to 0, are connected to the first lead; and those having that bit equal to 1 are connected to the second lead. In the second test, those nodes whose binary numbers have the next most significant bit equal to 0 are connected to the first lead, and those nodes whose binary numbers have that bit set to 1 are connected to the second lead. Continuing for successive screening tests in this way, it will be seen in the last test, those nodes whose binary numbers have the least signigicant bit equal to 0 are connected to the first lead, and those nodes whose binary numbers have that bit equal to 1 are connected to the second lead. For a board with $2^n$ nodes, there will thus have been n such screening tests. It is apparent, furthermore, that such screening tests will detect a short between any node pair because the numbers of those nodes must differ in at least one bit, and therefore that node pair will be tested in at least one of the screening tests.

From these considerations, it can also be seen that node number $2^n - 1$ is never connected to the first lead of the short detector 1, and different node number 0 is never connected to the second lead. This explains the previous comment in connection with FIG. 1, that one node need not be accessible to one lead of the short detector and that one other node need not be accessible to the other lead.

Figure 6:
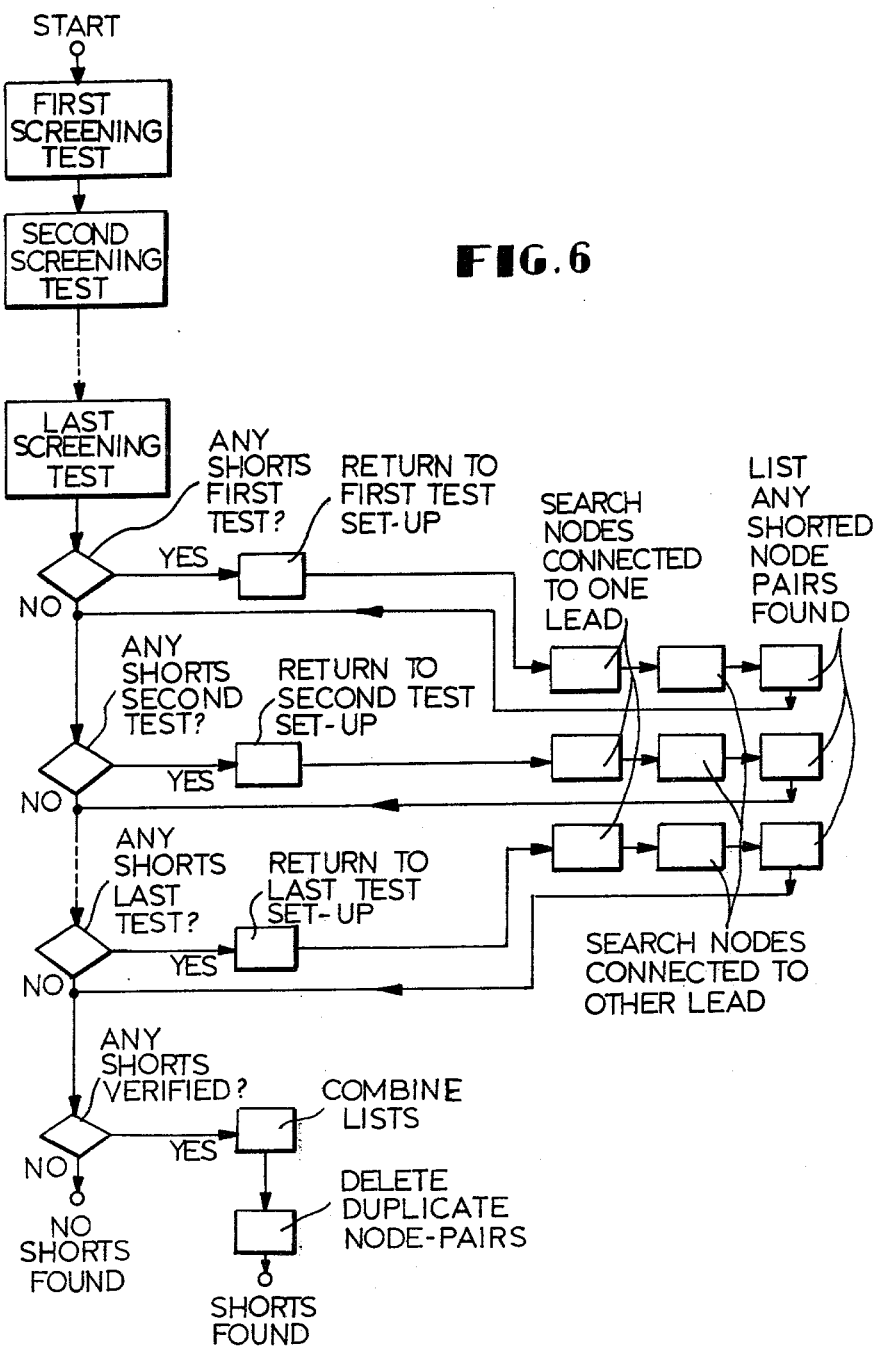
FIGS. 6, 7 and 8 are flow diagrams of preferred short-detecting screening and searching and determining sequences.

Turning now, to the second part of the process and FIG. 6, a series of searching tests is conducted if any of the screening tests indicated the presence of a short. This is done by returning to the nodal connections for a screening test which did indicate the presence of a short (such as "Return To First Test Set-Up" in FIG. 6). In order to identify the nodes of a shorted node pair, a binary search of the nodes connected to short detector lead A is conducted to find one or more shorted nodes. Such shorted nodes are then connected one at a time to short detector lead A to do a binary search of all nodes connected to short detector lead B ("Search Node" blocks in FIG. 6). By this process, all shorted node pairs detected by this screening test are found. A maximum of only 4 ($\log_2 N - 1$) tests need be made to find one such shorted node pair after it has been detected by one of said screening tests.

It will be observed that, because more than one shorted node pair may be detected by one such screening test, one must be prepared to follow more than one binary search in this search procedure.

Figure 7:
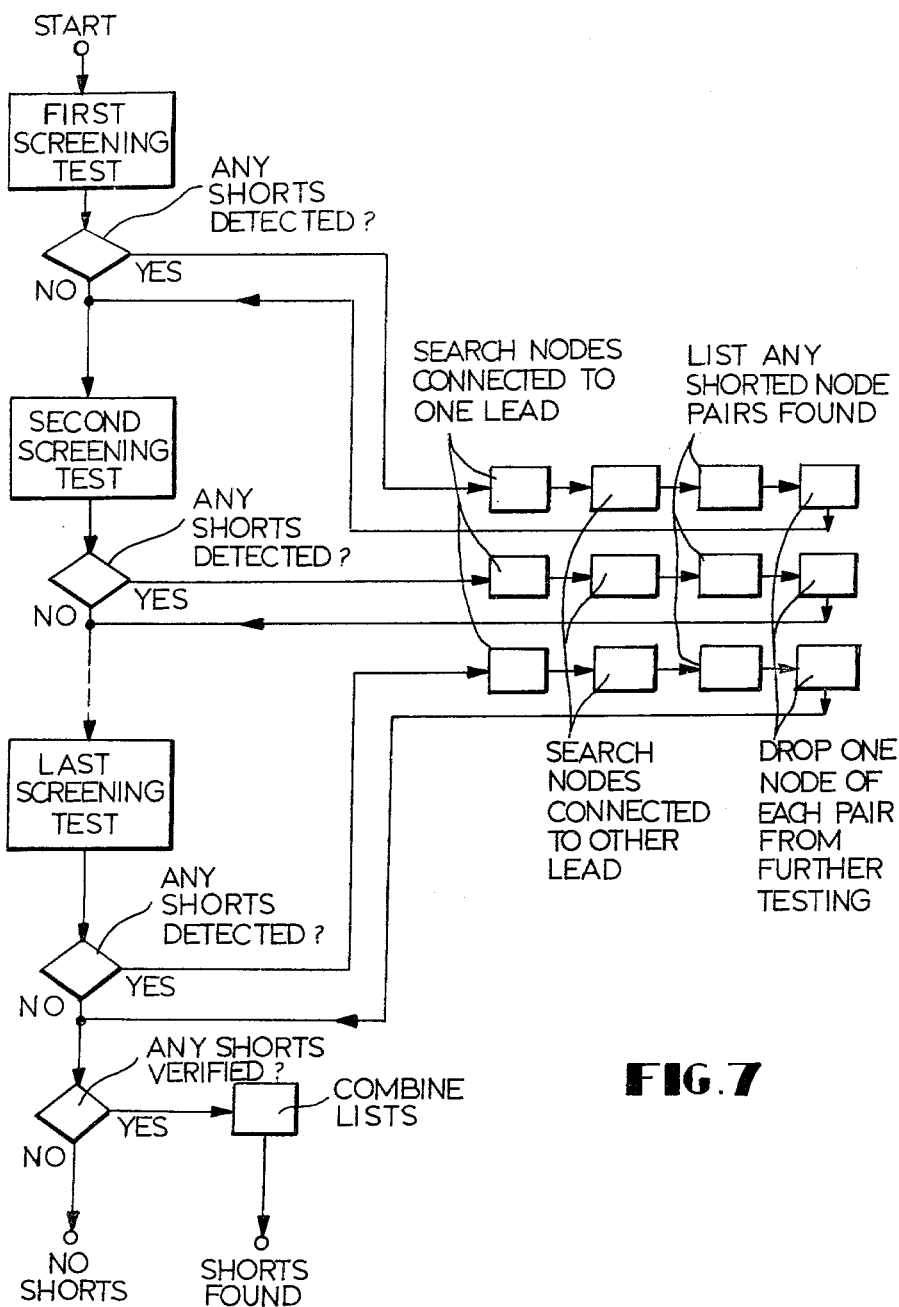

As before described, a further feature of the invention resides in the use of the same apparatus to prevent multiple redundant searches for a shorted node pair. As described above, shorted pairs of nodes whose binary numbers differ in more than one bit position will be detected in more than one screening test. To prevent redundant searches, the searching test is carried out completely after a short is detected in one of the screening tests as shown in the flow diagram of FIG. 7. Following the first screening tests, for example, in FIG. 7, the search for any detected shorts is shown conducted. Then, one node of each shorted pair found is disconnected during all further screening tests and subsequent searching tests, to eliminate searching redundantly for node pairs already found. (e.g. "Drop One Node Of Each Pair . . . ", FIG. 7).

As before mentioned, a further feature of this invention resides in its adaptability for testing for shorts in an assembled electronic circuit, as well. The screening tests are carried out by testing the resistance from half the nodes to the other half. Because of the shunting effects of the possibly large number of resistive components which may be connected in the circuit, the screening tests may give the appearance of the presence of shorts when true shorts do not exist. The number of tests required in such cases is greater than given by the above formula and shown in the accompanying table. As the searching tests proceed, the number of nodes included in each test is steadily reduced. Such shunting effects will thereby be steadily reduced and the apparent short will disappear. Therefore one must be prepared to abandon a search trail, in addition to following multiple trails as above described.

Figure 8:
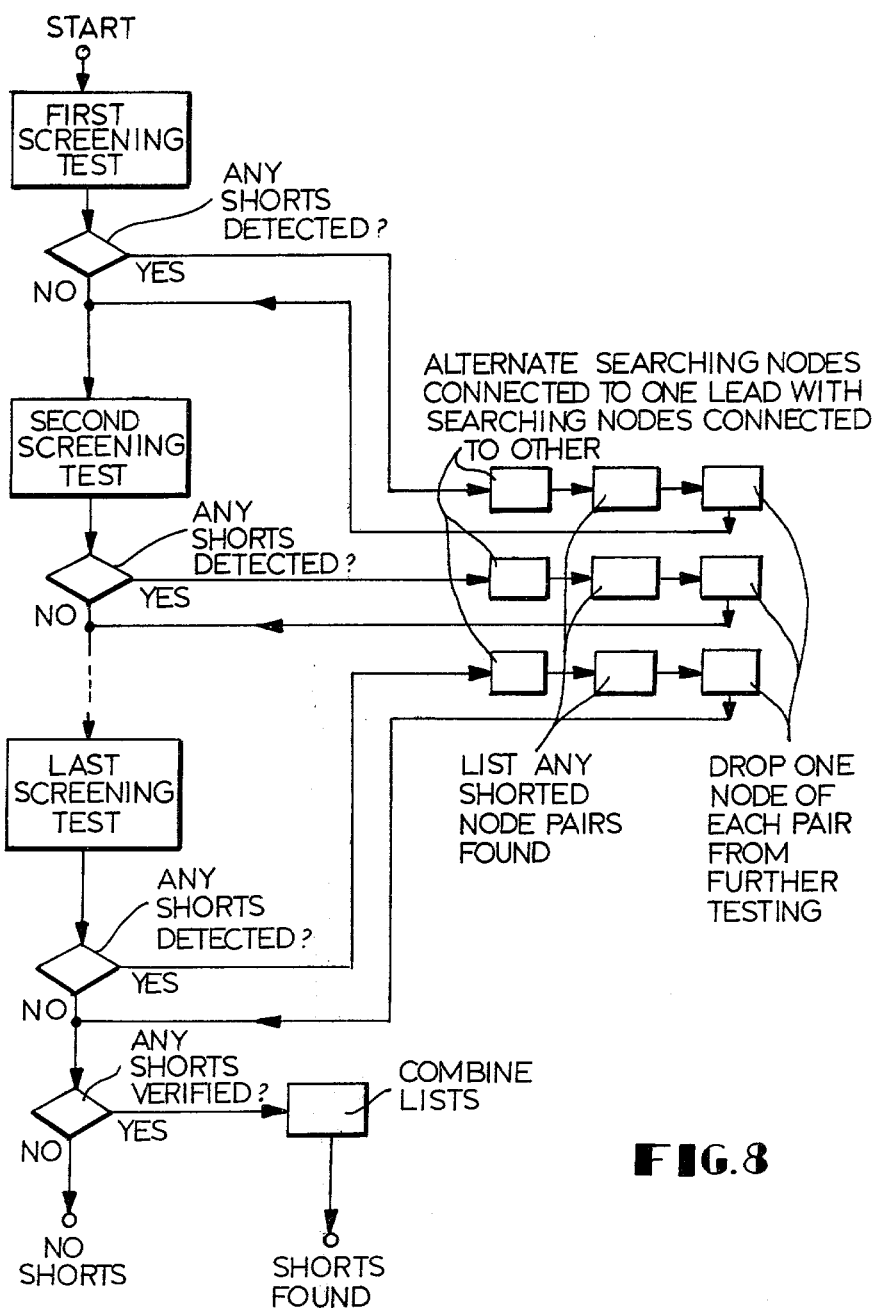

A further feature of this invention provides an improvement in dealing with such apparent shorts in as-sembled electronic circuits. By alternating the steps in the binary searching of those nodes connected to short detector lead A with the steps in the binary searching of those nodes connected to short detector lead B, FIG. 8, ("Alternate Searching Nodes . . . "), the total number of nodes involved in each successive test may be reduced at the greatest possible rate. At each step, half the remaining pairs connected to one lead or the other are disconnected. The absence of a true short is found out in this way with the least number of steps.

Further modifications will also occur to those skilled in the art, and such are considered to fall within the spirit and scope of the invention as defined in the appended claims.

What is claimed is:

1. Apparatus for detecting shorts and the like between the nodes of a system under test, the system having a plurality of such nodes, and for identifying shorted nodes, comprising short detection means provided with a pair of leads across which a short is to be detected; a pair of switch-connecting means, one associated with each of the leads and adapted, respectively, to connect a group of nodes together and to connect an associated lead to said group of said nodes; and means for operating the pair of switch-connecting means to connect one lead to a first group of nodes, the first group having up to and including half of said nodes while simultaneously connecting the other lead to a second group of nodes, the second group including the remaining nodes; said operating means including means for successively varying the population of nodes in each group to connect different populations of said nodes to the leads in accordance with a predetermined pattern to enable successive screening tests for detecting shorts between said different populations, said predetermined pattern varying the population of the group of nodes connected to each lead such that each node is tested against every other node at least once in substantially fewer tests than are required to test each node individually against every other node, and means operable in the event that a short is detected for successively reducing the number of nodes connected to each lead until each lead is connected to only one shorted node, to search for and identify a shorted node pair.

2. Apparatus as claimed in claim 1 and in which each of said pair of switch-connecting means connects to all but a predetermined one of said nodes, such predetermined one node being different for each of the switching-connecting means of the pair.

3. Apparatus as claimed in claim 1 wherein the operating means further comprises means, operable following the screening test in which a short is found and the determination of the shorted node pair, for eliminating said shorted node pair from further testing.

4. Apparatus as claimed in claim 1 and in which said system comprises assembled electronic components, and wherein the operating means further comprises means for alternately reducing the number of nodes connected to each of the pair of leads.

5. Apparatus as claimed in claim 1 and in which said predetermined pattern of successive screening tests is as follows: dividing the nodes into half with each half being connected to one of said leads; then dividing the nodes into fourths with the odd numbered fourths being connected to one lead and the even numbered fourths being connected to the other lead; and then dividing the nodes into eighths with the odd numbered eighths being connected to one lead and the even numbered eighths being connected to the other lead; and so on until all odd numbered nodes are connected to one lead and all even numbered nodes are connected to the other lead.

6. Apparatus as claimed in claim 1 and in which the short detector means comprises a voltage source connected in series with current-measuring means and said leads and said switch-connecting means.

7. Apparatus as claimed in claim 1 and in which said short detector means comprises a current source connected in parallel with voltage-measuring means and said leads and said switch-connecting means.

8. Apparatus as claimed in claim 1 and in which said short detector means comprises a dc voltage source, a resistance bridge containing said leads and said switch-connecting means as an arm, and other resistive arms of value corresponding to a preselected short value, and voltage discriminator means for providing a control output signal.

9. Apparatus as claimed in claim 8 and in which said output signal is connected to said operating means and said operating means comprises computer control means.

10. Apparatus as claimed in claim 1 and in which the said screening tests comprise $\log_2 N$ tests, where N is the number of said plurality of nodes in said system and said searching consists of no more than 4 ($\log_2 N - 1$) tests per shorted pair of nodes.

11. Apparatus as claimed in claim 1 and in which the operating means includes means for alternating the said screening tests and said searching, and means operable when a shorted node pair is identified, for excluding one of the nodes of said pair from further screening and searching tests to prevent redundant testing.

12. Apparatus as claimed in claim 11 in which the number of said tests required for full identification of shorted node pairs among N nodes is $\log_2 N + 4M (\log_2 N - 1)$, where M is the number of shorts found.

13. A method of reducing the number of tests required to detect shorts and the like between nodes of a system under test, the system having a plurality of such nodes, and to identify shorted nodes, the method including screening tests to detect whether a short exists between any of the nodes and, in the event that a short is detected, searching tests to identify the shorted nodes, the method comprising the steps of connecting together a first group of nodes and connecting together a second group of nodes, the first group containing up to and including half of the nodes of said plurality and the second group containing the remaining nodes of said plurality; successively testing for a short between the first and second groups of nodes; varying, in the course of said testing, the populations of nodes contained in the first and second groups in accordance with a predetermined pattern to perform successive screening tests for shorts between different populations of nodes, said predetermined pattern varying the populations of the groups such that each node is tested against every other node at least once in substantially fewer tests than are required to test each node individually against every other node; and, in the event that a short is detected in said screening tests, performing searching tests, in the course of said testing, by successively eliminating nodes from the first group until that group contains only one shorted node, and successively eliminating nodes from the second group until that group contains only one shorted node, thereby permitting the identification of a shorted node pair.

14. A method as claimed in claim 13, wherein a predetermined first one of said nodes is included only in the first group, and a predetermined second one of said nodes is included only in the second group.

15. A method as claimed in claim 13, wherein said step of varying the populations of nodes in accordance with a predetermined pattern comprises the steps of dividing said plurality of nodes into first and second halves, the first and second halves being included in the first and second groups, respectively; then dividing said plurality of nodes into fourths, with the odd numbered fourths being included in the first group and with the even numbered fourths being included in the second group; then dividing said plurality of nodes into eighths, with the odd numbered eighths being included in the first group and with the even numbered eighths being included in the second group; and then dividing said plurality of nodes into sixteenths, with the odd numbered sixteenths being included in the first group and the even numbered sixteenths being included in the second group; and so on, until the plurality of nodes is divided into subgroups which contain a single node, with the odd numbered nodes being included in the first group and the even numbered nodes being included in the second group.

16. A method as claimed in claim 13, wherein the said system comprises assembled electronic components and wherein searching of nodes in the first group is alternated with searching of nodes in the second group, rapidly to identify a false short.

17. A method as claimed in claim 13 wherein, when a shorted node pair is determined, the further step is performed of eliminating from further testing one node of said shorted node pair.

18. A method as claimed in claim 5 and in which the number of said nodes N bears the relationship $N = 2^n$ to the number of screening tests n.

19. A method of reducing the number of tests required to detect shorts and the like between the nodes of a system under test, the system having a plurality of such nodes, and to identify shorted nodes, the method including screening tests to detect whether a short exists between any of the nodes and, in the event that a short is detected, searching tests to identify the shorted nodes, the method comprising the steps of grouping the plurality of nodes into first and second groups; connecting together the nodes in each group; testing for a short between the first group and the second group; successively varying, in the course of said testing, the populations of nodes included within the two groups in accordance with a predetermined pattern to perform successively said screening tests, said predetermined pattern varying the populations of the groups such that each node is tested against every other node at least once in substantially fewer tests than are required to test each node individually against every other node; and, upon detecting that a short exists, performing said searching tests by successively reducing, in the course of said testing, the number of nodes included within each group to search for a shorted node pair.

20. A method as claimed in claim 19, wherein said step of successively varying the combinations of nodes included within the two groups in accordance with a predetermined pattern comprises the steps of successively dividing the plurality of nodes into subgroups of halves, fourth, eighths, and so forth, of nodes, until said subgroups each contain a single node; and successively including in the first group half of the nodes, odd numbered subgroups of fourths of the nodes, odd numbered subgroups of eighths of the nodes, and so forth until the first group contains only odd numbered nodes, while simultaneously including within the second group corresponding even numbered subgroups of nodes.

* * * * *